US012710698B2

(12) United States Patent
Feler

(10) Patent No.: US 12,710,698 B2
(45) Date of Patent: Aug. 18, 2026

(54) METHODS FOR MEASUREMENT OF rAIM

(71) Applicant: KLA Corporation, Milpitas, CA (US)

(72) Inventor: Yoel Feler, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/999,696

(22) Filed: Dec. 23, 2024

(65) Prior Publication Data

US 2025/0314973 A1 Oct. 9, 2025

Related U.S. Application Data

(60) Provisional application No. 63/631,457, filed on Apr. 9, 2024.

(51) Int. Cl.
*G03F 7/00* (2006.01)

(52) U.S. Cl.
CPC ...... *G03F 7/70633* (2013.01); *G03F 7/70683* (2013.01); *G03F 7/706849* (2023.05); *G03F 7/706851* (2023.05)

(58) Field of Classification Search
CPC ............ G03F 7/70633; G03F 7/70683; G03F 7/70681; G03F 7/706831; G03F 7/706849; G03F 7/706851; G03F 7/70653; G01B 11/14; G01B 11/272; G01B 11/27
See application file for complete search history.

(56) References Cited

U.S. PATENT DOCUMENTS 6,921,916 B2 7/2005 Adel et al.
7,068,833 B1 6/2006 Ghinovker et al.
7,177,457 B2 2/2007 Adel et al.
7,249,105 B1 7/2007 Peinado et al.
7,349,105 B2 3/2008 Weiss
7,440,105 B2 10/2008 Adel et al.
7,528,941 B2 5/2009 Kandel et al.
(Continued)

FOREIGN PATENT DOCUMENTS

KR 102545517 B1 6/2023

OTHER PUBLICATIONS

Korean Intellectual Property Office, International Search Report and Written Opinion received in International Application No. PCT/US2025/022398, Jul. 4, 2025, 7 pages.

*Primary Examiner* — Gordon J Stock, Jr.
(74) *Attorney, Agent, or Firm* — Suiter Swantz IP

(57) ABSTRACT

An overlay metrology system may receive an image of an overlay target on a sample in accordance with a metrology recipe, wherein the image is generated by illuminating via oblique illumination an overlay target comprising a plurality of Moiré structures with one or more pairs of illumination beams, wherein portions of the image associated with one or more Moiré structures of the plurality of Moiré structures having periodicity along a measurement direction are formed via Moiré diffraction orders from one of the one or more pairs of the illumination beams having a dipole separation axis orthogonal to the measurement direction, wherein the plurality of Moiré structures include Moiré structures comprising two or more gratings with overlapping regions. The overlay metrology system may determine overlay measurements associated with relative positions of sample layers based on the image of the overlay target.

31 Claims, 12 Drawing Sheets

(56) References Cited

U.S. PATENT DOCUMENTS

| | | | | |
|---|---|---|---|---|
| 7,540,105 | B2 | 6/2009 | Case | |
| 9,760,020 | B2 | 9/2017 | Amir | |
| 10,197,389 | B2 | 2/2019 | Levinski et al. | |
| 11,164,307 | B1 * | 11/2021 | Feler | G02B 27/60 |
| 11,346,657 | B2 * | 5/2022 | Manassen | G03F 7/706849 |
| 11,604,149 | B2 * | 3/2023 | Feler | G03F 7/70633 |
| 11,841,621 | B2 * | 12/2023 | Hill | G01B 11/14 |
| 12,235,588 | B2 * | 2/2025 | Manassen | G01B 9/02084 |
| 2009/0034082 | A1 | 2/2009 | Commander et al. | |
| 2010/0310130 | A1 | 12/2010 | Beghuin et al. | |
| 2012/0069344 | A1 | 3/2012 | Liu | |
| 2016/0300767 | A1 | 10/2016 | Ko et al. | |
| 2018/0157058 | A1 | 6/2018 | Chou et al. | |
| 2018/0188663 | A1 | 7/2018 | Levinski et al. | |
| 2018/0321487 | A1 | 11/2018 | Chang et al. | |
| 2020/0124408 | A1 | 4/2020 | Hill et al. | |
| 2020/0132446 | A1 | 4/2020 | Shalibo et al. | |
| 2020/0249585 | A1 | 8/2020 | Ghinovker | |
| 2021/0072650 | A1 | 3/2021 | Feler et al. | |
| 2021/0233821 | A1 | 7/2021 | Feler et al. | |
| 2023/0259040 | A1 | 8/2023 | Hill et al. | |
| 2023/0328351 | A1 | 10/2023 | Vaknin et al. | |
| 2024/0053687 | A1 | 2/2024 | Levinski et al. | |
| 2024/0427252 | A1 * | 12/2024 | Manassen | G03F 7/70633 |

* cited by examiner 104
204a
202a
204b
202b
202

X
Y 204b
206b
202b
210b
Q
P
X
Z 204a
206a
202a
210a
P
Q
208
212
X
Z

METHODS FOR MEASUREMENT OF rAIM

CROSS-REFERENCE TO RELATED APPLICATION

The present application claims the benefit under 35 U.S.C. § 119(e) of U.S. Provisional Application Ser. No. 63/631,457, filed Apr. 9, 2024, which is incorporated herein by reference in the entirety.

TECHNICAL FIELD

The present disclosure relates to the measurement of targets in imaging systems, and, in particular, to the measurement of robust advanced imaging technology (rAIM) targets in semiconductor metrology systems.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Further, metrology systems that have been developed to measure smaller feature sizes may be less able to effectively measure larger feature sizes. Accordingly, it is desirable to develop systems and methods to address these demands.

SUMMARY

An overlay metrology system is disclosed, in accordance with one or more embodiments of the present disclosure. In one illustrative embodiment, the overlay metrology system includes one or more controllers comprising one or more processors configured to execute program instructions. In another illustrative embodiment, the program instructions include an image of an overlay target on a sample in accordance with a metrology recipe, wherein the overlay target includes one or more Moiré structures having directions of periodicity along one or more measurement directions, wherein the image is generated by illuminating the overlay target with oblique illumination having one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction. In another illustrative embodiment, the program instructions include determining overlay measurements associated with relative positions of sample layers along the one or more measurement directions based on the image of the overlay target.

An overlay metrology system is disclosed, in accordance with one or more embodiments of the present disclosure. In one illustrative embodiment, the overlay metrology system includes an illumination sub-system including one or more lenses configured to illuminate via oblique illumination an overlay target on a sample in accordance with a metrology recipe, wherein the overlay target includes one or more Moiré structures having directions of periodicity along one or more measurement directions, wherein an image is generated by illuminating the overlay target one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction. In another illustrative embodiment, the metrology sub-system includes a collection sub-system including at least an objective lens configured to collect at least one Moiré diffraction order associated with diffraction of the one or more Moiré structures by the one or more oblique illumination beams. In another illustrative embodiment, the overlay metrology sub-system further includes a detector configured to generate an image of the overlay target using illumination collected by the collection sub-system. In another illustrative embodiment, the overlay metrology sub-system further includes a controller communicatively coupled to the collection sub-system, the controller including one or more processors configured to execute program instructions causing the one or more processors to receive the image of the overlay target, and determine overlay measurements associated with relative positions of sample layers along the one or more measurement directions based on the image of the overlay target.

A metrology method is disclosed, in accordance with one or more embodiments of the present disclosure. In one illustrative embodiment, the metrology method includes receiving an image of an overlay target on a sample in accordance with a metrology recipe, wherein the overlay target includes one or more Moiré structures having directions of periodicity along one or more measurement directions, wherein the image is generated by illuminating the overlay target with oblique illumination having one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction. In another illustrative embodiment, the metrology method includes determining overlay measurements associated with relative positions of sample layers along the one or more measurement directions based on the image of the overlay target.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

DETAILED DESCRIPTION

Figure 1A:
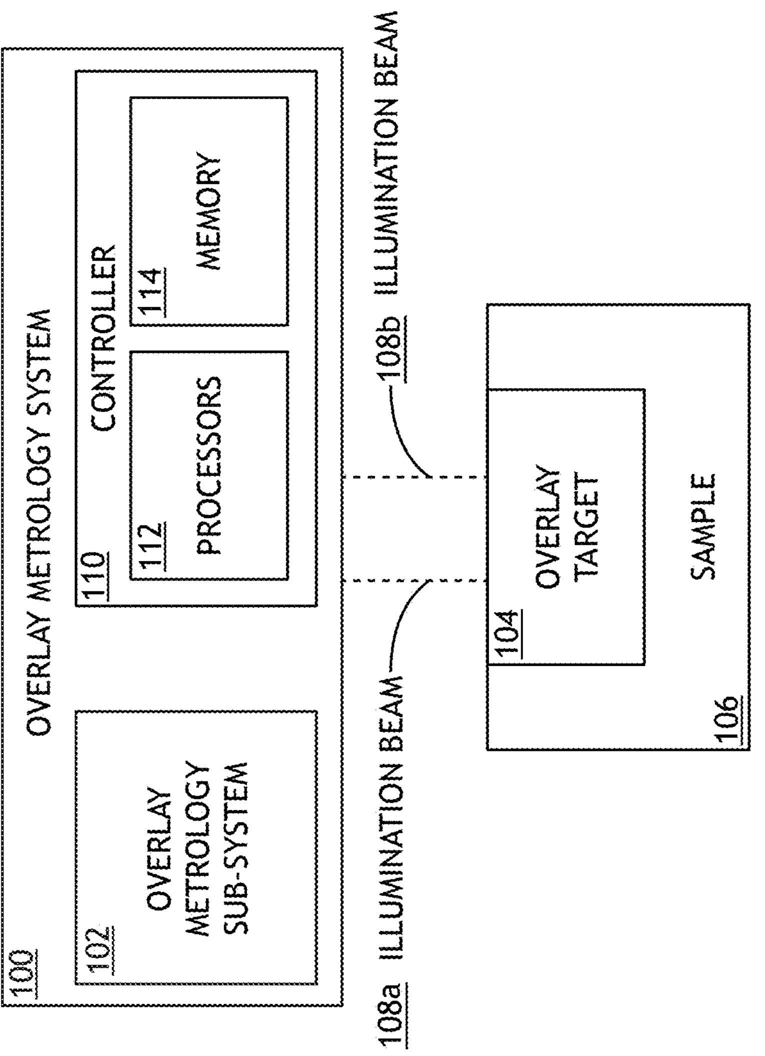
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing imaging of Moiré structures on overlay targets with oblique illumination having an azimuth incidence angle that is orthogonal to a direction of periodicity of the Moiré structures. A Moiré structure may be formed as overlapping periodic structures of different pitch but having a common direction of periodicity, which corresponds to a measurement direction. In embodiments, a Moiré structure having periodicity along a particular measurement direction (e.g., an X direction) is imaged based on at least one illumination beam having an azimuth incidence angle that is orthogonal to this particular measurement direction (e.g., a Y direction).

It is contemplated herein that imaging based on illumination having an azimuth incidence angle or an azimuth incidence direction orthogonal to a direction of periodicity may provide substantially greater flexibility for selection of measurement parameters (e.g., measurement wavelength, target pitch, or the like) than possible with traditional imaging techniques based on normal illumination, illumination with an azimuth angle aligned with a direction of periodicity of a Moiré structure, or rotated illumination having an azimuth angle rotated relative to a direction of periodicity of a Moiré structure by an angle less than 90 degrees. In particular, orthogonal oblique illumination as disclosed herein enables greater flexibility in selecting the polar incidence angle than existing techniques.

As an illustration, the systems and methods disclosed herein may enable greater flexibility for measuring an overlay target including Moiré structures having a certain pitch than existing techniques. In particular, it may be the case that traditional imaging techniques may limit a bandwidth of allowable wavelengths suitable imaging of a Moiré structure with relatively large pitches (e.g., on the order of 600 nm or higher). Further, the allowable bandwidths may not necessarily provide the desired sensitivity. However, the systems and methods disclosed herein may enable imaging of such Moiré structures with a larger range of wavelengths and/or with more desirable wavelengths.

As another illustration, the systems and methods disclosed herein may enable greater flexibility in designing an overlay target to include Moiré structures with particular pitch values (e.g., to satisfy fabrication requirements, or the like). In particular, the imaging wavelength flexibility offered by systems and methods disclosed herein may enable otherwise difficult to measure Moiré structures to be used in an overlay target.

Referring now to FIGS. 1A-8, systems and methods for imaging for overlay metrology are described in greater detail, in accordance with one or more embodiments of the present disclosure.

FIG. 1A is a conceptual view of an overlay metrology system 100, in accordance with one or more embodiments of the present disclosure. In embodiments, the overlay metrology system 100 includes an overlay metrology sub-system 102 configured to image an overlay target 104 having one or more Moiré structures based on oblique illumination with one or more illumination beams 108 having azimuth incidence angles orthogonal to a direction of periodicity (e.g., associated with a measurement direction) of the Moiré structures. For example, FIG. 1A depicts imaging with a pair of illumination beams 108*a*, 108*b*.

The overlay metrology system 100 may include a controller 110 communicatively coupled to the overlay metrology sub-system 102. The controller includes one or more processors 112 configured to execute a set of program instruction maintained in a memory 114. The controller 110 may thus be configured to perform various processing steps described herein such as, but not limited to, receiving one or more images of an overlay target 104 from the overlay metrology sub-system 102 or generating overlay measurements based on the one or more images. In some embodiments, the controller 110 may direct or otherwise control other components of the overlay metrology system 100 and/or external components. For example, the controller 110 may direct the overlay metrology sub-system 102 to generate images based on one or more selected metrology recipes.

As another example, the controller 110 may generate correctables to control one or more processing tools (e.g., a lithography tool, an etching tool, a polishing tool, or the like) based on overlay measurements.

For the purposes of the present disclosure, the term overlay is generally used to describe relative positions of features on a sample fabricated by two or more lithographic patterning steps, where the term overlay error describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Figure 1B:
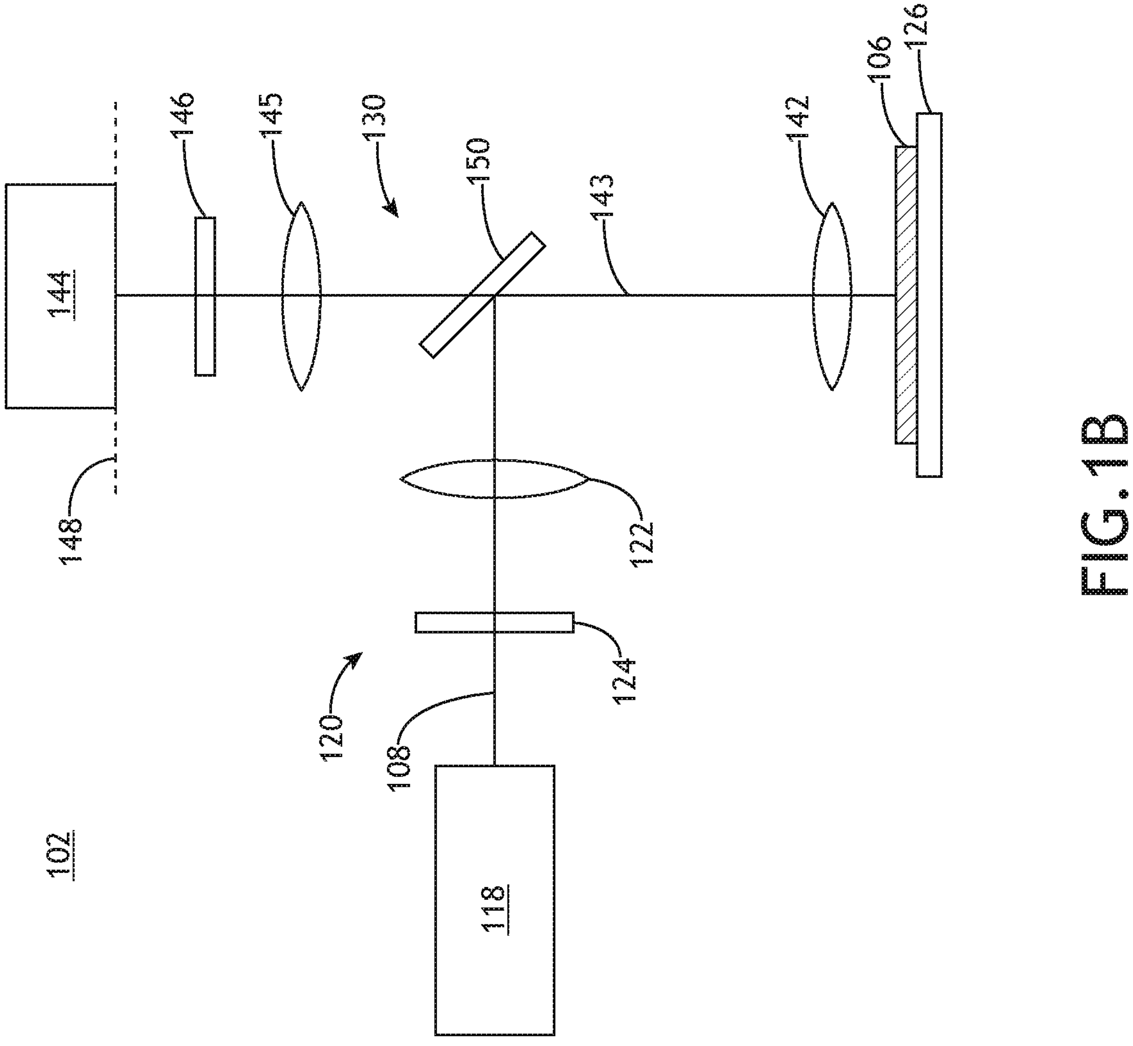
FIG. 1B is a schematic view illustrating the overlay metrology sub-system, in accordance with one or more embodiments of the present disclosure.

FIG. 1B is a schematic view illustrating the overlay metrology sub-system 102, in accordance with one or more embodiments of the present disclosure. In embodiments, the overlay metrology sub-system 102 includes an illumination source 118 configured to generate one or more illumination beams 108 suitable. An illumination beam 108 may include light with any wavelengths or spectrum including, but not limited to, ultraviolet (UV) radiation, visible radiation, or infrared (IR) radiation.

The illumination source 118 may include any type of illumination source suitable for providing at least one illumination beam 108. In embodiments, the illumination source 118 is a laser source. For example, the illumination source 118 may include, but is not limited to, one or more narrowband laser sources, a broadband laser source, a supercontinuum laser source, or a white light laser source. In embodiments, the illumination source 118 includes a laser-sustained plasma (LSP) source. For example, the illumination source 118 may include, but is not limited to, an LSP lamp, an LSP bulb, or an LSP chamber suitable for containing one or more elements that, when excited by a laser source into a plasma state, may emit broadband illumination.

In embodiments, the overlay metrology sub-system 102 directs the illumination beams 108 to the overlay target 104 via an illumination sub-system 120. The illumination sub-system 120 may include one or more optical components suitable for modifying and/or conditioning the illumination beam 108 as well as directing the illumination beam 108 to the overlay target 104.

In embodiments, the illumination sub-system 120 includes one or more illumination sub-system lenses 122 (e.g., to collimate the illumination beam 108, to relay pupil and/or field planes, or the like). In embodiments, the illumination sub-system 120 includes one or more illumination sub-system optics 124 to shape or otherwise control the illumination beam 108. For example, the illumination sub-system optics 124 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). In embodiments, the overlay metrology sub-system 102 may include a stage 126.

The illumination sub-system 120 may provide illumination beams 108 using any technique known in the art. In embodiments, the illumination sub-system 120 includes one or more apertures at an illumination pupil plane to divide illumination from the illumination source 118 into two or more illumination beams 108. In embodiments, the illumination sub-system 120 generates illumination beams 108 by providing light in two or more optical fibers, where light output from each optical fiber provided at or directed to an illumination pupil to provide an illumination beam 108. In embodiments, the illumination source 118 generates illumination beams 108 by diffracting illumination from the illumination source 118 into two or more diffraction orders, where at least one of the diffraction orders forms at least one illumination beam 108. Efficient generation of multiple illumination beams through controlled diffraction is generally described in U.S. Patent Publication No. US2020/0124408 titled Efficient Illumination Shaping for Scatterometry Overlay, which is incorporated herein by reference in its entirety.

In embodiments, the overlay metrology sub-system 102 includes an objective lens 142 to direct the one or more illumination beams 108 onto the overlay target 104. The objective lens 142 may further capture light emanating from the overlay target 104 (e.g., collected light 143).

In embodiments, the overlay metrology sub-system 102 includes the collection sub-system 130 to direct at least a portion of the collected light 143 from the objective lens 142 to one or more detectors 144. The collection sub-system 130 may include one or more optical elements suitable for modifying and/or conditioning the collected light 143 from the sample 106. In embodiments, the collection sub-system 130 includes one or more collection sub-system lenses 145 (e.g., to collimate the illumination beam 108, to relay pupil and/or field planes, or the like), which may include, but is not required to include, the objective lens 142. In embodiments, the collection sub-system 130 includes one or more collection sub-system optics 146 to shape or otherwise control the collected light 143. For example, the collection sub-system optics 146 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In embodiments, the overlay metrology sub-system 102 includes at least one detector 144 at a detection plane 148 to capture collected light 143 associated with diffraction of light from the overlay target 104, where the detection plane 148 corresponds to a collection field plane. In this way, an image of the Moiré structures within an overlay target 104 may correspond to an interference pattern (e.g., a fringe pattern) associated with interference of the diffraction lobes passed to the detector 144.

The overlay metrology sub-system 102 may generally include any number or type of detectors 144 suitable for capturing light from the sample 106 indicative of overlay. In embodiments, a detector 144 may include a two-dimensional pixel array (e.g., a focal plane array) such as, but not limited to, a charge-coupled device (CCD) or a complementary metal-oxide semiconductor (CMOS) device.

In some embodiments, the overlay metrology sub-system 102 includes multiple detectors 144 in multiple collection channels, which may be suitable for separately imaging Moiré structures with different directions of periodicity. For example, although not shown, the overlay metrology sub-system 102 may include one or more channel splitting optics to split the collected light 143 into different collection channels. The channel splitting optics may include, but are not limited to, one or more wavelength filters, one or more polarizers, or one or more pupil-splitting components (e.g., prisms, or the like).

The illumination sub-system 120 and the collection sub-system 130 of the overlay metrology sub-system 102 may be oriented in a wide range of configurations suitable for illuminating the sample 106 with the illumination beam 108 and collecting light emanating from the sample 106 in response to the incident illumination beam 108. For example, as illustrated in FIG. 1B, the overlay metrology sub-system 102 may include a beamsplitter 150 oriented such that a common objective lens 142 may simultaneously direct the illumination beam 108 to the sample 106 and collect light from the sample 106. By way of another example, the illumination sub-system 120 and the collection sub-system 130 may contain non-overlapping optical paths such that the illumination beams 108 are directed to the sample 106 outside of the objective lens 142.

Further, the overlay metrology sub-system 102 may be configurable to generate measurements based on any number of recipes defining measurement parameters. For example, a recipe of an overlay metrology sub-system 102 may include, but is not limited to, parameters associated with an incidence illumination beam 108 (e.g., wavelength, angle of incidence, polarization, spot size, focal depth, or the like), parameters associated with a portion of collected light 143 that reaches a detector 144 (e.g., wavelength, collection angle, polarization, imaging depth, or the like), or parameters associated with a detector 144 (e.g., integration time, gain, or the like).

Referring now generally to FIGS. 1A-1B, it is contemplated herein that a distribution of diffraction orders from a Moiré structure is dependent on various characteristics of both the illumination and the grating structure, including a pitch of constituent gratings in the Moiré structure, a difference between pitches in the Moiré structure (e.g., associated with a Moiré gain), a wavelength of an illumination beam 108, an azimuth incidence angle of an illumination beam 108, and a polar incidence angle of an illumination beam 108. Accordingly, embodiments of the present disclosure are directed to selecting or otherwise controlling properties of illumination used in an overlay measurement based on properties of an overlay target or intended overlay target design in order to achieve a desired distribution of diffraction orders from the overlay target. For example, various parameters of illumination (e.g., wavelength and/or distance between illumination lobes) directed to a sample may be controlled to provide selected diffraction orders that are collected by collection optics and are thus available to contribute to an image of the sample or an associated measurement.

Some embodiments of the present disclosure are directed to providing recipes for configuring the overlay metrology sub-system 102 to generate images based on selected imaging conditions. An overlay metrology sub-system 102 is typically configurable according to a recipe including a set of parameters for controlling various aspects of an overlay measurement such as, but not limited to, the illumination of a sample, the collection of light from the sample, or the position of the sample during a measurement. In this way, the overlay metrology sub-system 102 may be configured to provide a selected type of measurement for one or more overlay target designs of interest. For example, a metrology recipe may include illumination parameters such as, but not limited to, an illumination wavelength, an illumination band, an illumination pupil distribution, a polarization of incident illumination, or a spatial distribution of illumination (e.g., distances between illumination beams). By way of another example, a metrology recipe may include collection parameters such as, but not limited to, a collection pupil distribution (e.g., a desired distribution of angular light from the sample to be used for a measurement and associated filtered intensities at those angles), wavelength filters, or parameters for controlling one or more detectors. By way of another example, a metrology recipe may include various aspects of a design of an overlay target 104 including, but not limited to, a number of Moiré structures, an arrangement of Moiré structures, pitch values of constituent gratings in Moiré structures, or the like. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed or scan pattern).

Referring now to FIGS. 2A-7C, imaging of an overlay target 104 including Moiré structures with oblique illumination having an azimuth incidence angle orthogonal to a direction of periodicity of the Moiré structures is described in greater detail, in accordance with one or more embodiments of the present disclosure.

Figure 2A:
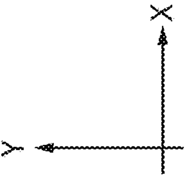
FIG. 2A illustrates a top view of an overlay target, in accordance with one or more embodiments of the present disclosure.
Figures 2B, 2C:
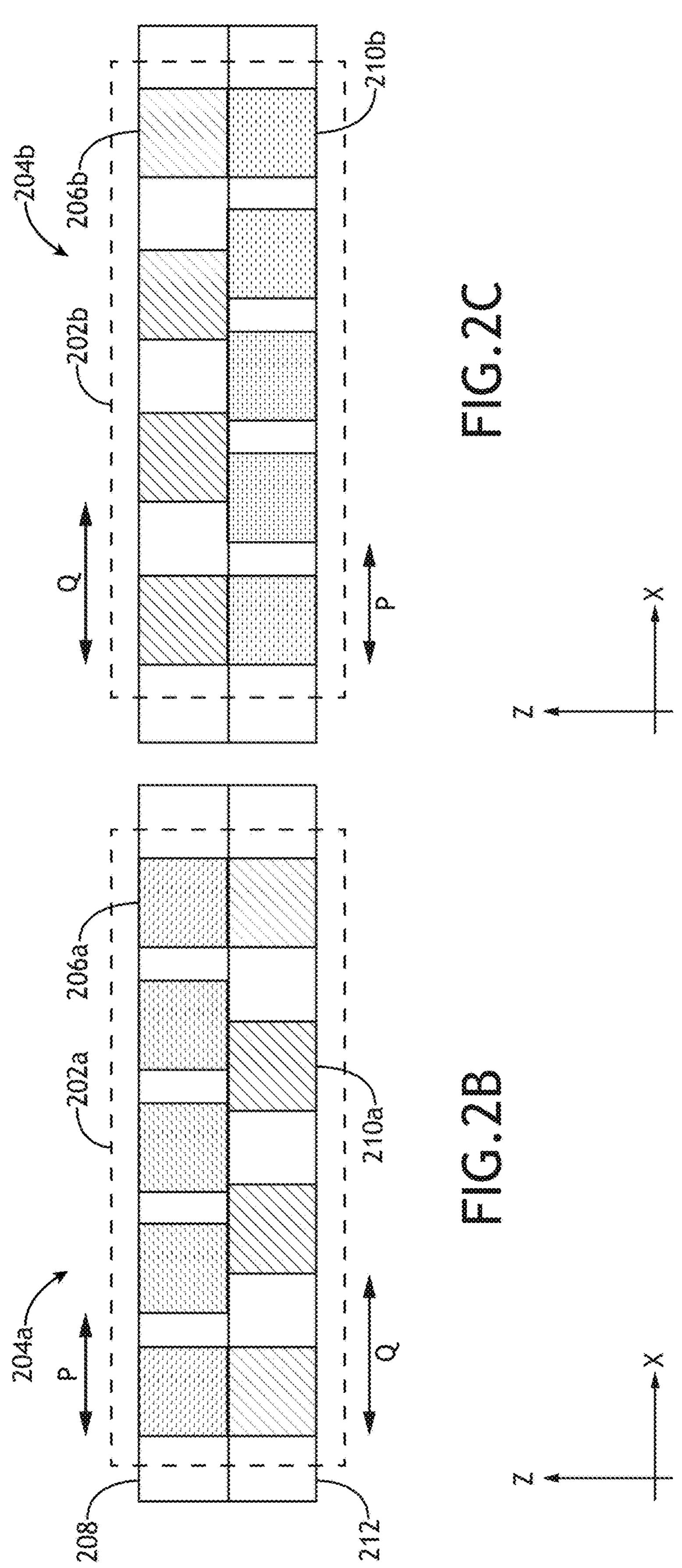
FIG. 2B illustrates a side view of a cell that includes a Moiré structure forming a portion of a quadrant of an rAIM overlay target as depicted in FIG. 2A, in accordance with one or more embodiments of the present disclosure.
FIG. 2C illustrates a side view of a cell that includes a Moiré structure forming a portion of a quadrant of an rAIM overlay target as depicted in FIG. 2A, in accordance with one or more embodiments of the present disclosure.

FIG. 2A illustrates a top view of an overlay target 104 (e.g., a rAIM overlay target), in accordance with one or more embodiments of the present disclosure. FIG. 2B and FIG. 2C illustrate a side view of two cells 202*a*, 202*b* that include Moiré structures 204*a*, 204*b* that may form a portion of a quadrant of an rAIM overlay target 104 as depicted in FIG. 2A, in accordance with one or more embodiments of the present disclosure.

Moiré structures 204*a*, 204*b* may include two gratings in overlapping regions of the sample 106, where the gratings on the different sample layers have different pitches. An overlay target 104 may generally include any number of Moiré structures in any arrangement. For example, FIG. 2A depicts a non-limiting configuration in which an overlay target 104 includes first Moiré structures 204*a* and second Moiré structures 204*b* oriented to facilitate measurements along orthogonal measurement directions (e.g., X and Y directions in the figure), where the first Moiré structures 204*a* may have different pitches and/or pitch configurations than the second Moiré structures 204*b*.

As an illustration, FIG. 2B depicts a first Moiré structure 204*a* having an upper grating 206*a* (e.g., a first grating) with a first pitch (P) on a first layer 208 of the sample 106 and a lower grating 210*a* (e.g., a second grating) with a second pitch (Q) on a second layer 212 of the sample 106, which may be referred to as a PQ Moiré structure. FIG. 2C illustrates a second Moiré structure 204*b* having an upper grating 206*b* (e.g., a third grating) with the second pitch (Q) on the first layer 208 of the sample 106 and a lower grating 210*b* (e.g., a fourth grating) with the first pitch (P) on the second layer 212 of the sample 106, which may be referred to as a QP Moiré structure. Such a layout of complementary PQ and QP Moiré structures may result in opposing shifts of imaged interference fringes in the presence of a physical (e.g., unintended) overlay error.

As another example, though not explicitly shown, the second Moiré structure 204*b* has an upper grating 206*b* with pitch(S) on the first layer 208 of the sample 106 and a lower grating 210*b* with pitch (T) on the second layer 212 of the sample 106.

In the context of the present disclosure, references to "first layer," "second layer," "third layer," or the like are intended merely to distinguish various sample layers and do not indicate a physical ordering of layers on the sample. Accordingly, a "first layer" may be above or below a "second layer" on the sample.

FIGS. 3A-7C depict illumination and collection of double-diffraction orders (e.g., Moiré diffraction orders) providing Moiré gain.

In embodiments, the overlay metrology sub-system 102 images a Moiré structure having periodicity along a particular measurement direction by directing at least one illumination beam to the Moiré structure that has an oblique polar incidence angle and an azimuth incidence angle orthogonal to the particular measurement direction. The overlay metrology sub-system 102 may then collect Moiré diffraction lobes (e.g., double diffraction lobes) from this orthogonal illumination for image generation. In some embodiments, a combination of the pitches of the Moiré structures, wavelengths associated with the one or more illumination beams, and/or the incidence angles are selected in accordance with a metrology recipe to limit the collection of light to the Moiré diffraction lobes of interest (as well as zero-order diffraction in some cases).

Figures 3A, 3B:
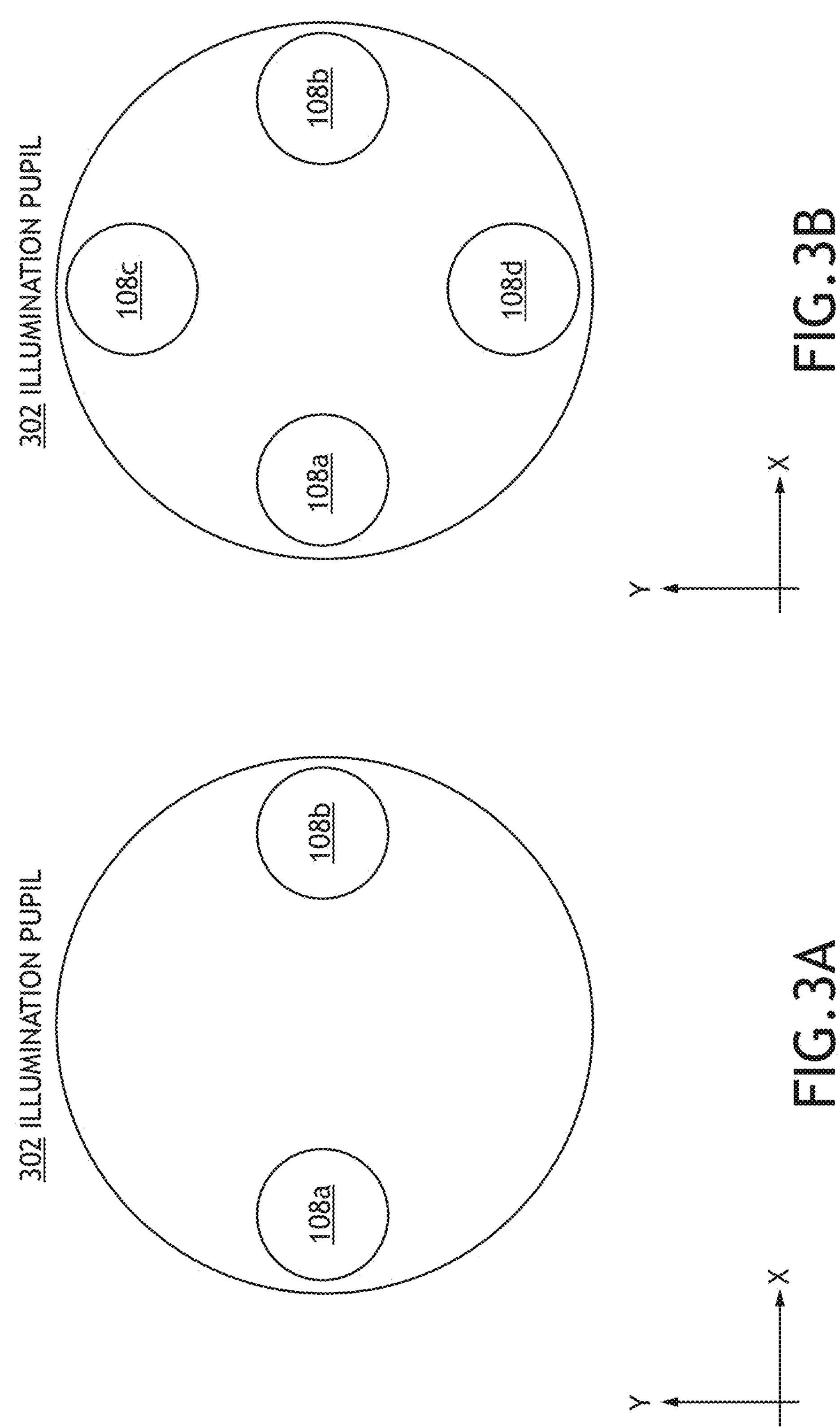
FIG. 3A is a top view of an illumination pupil illustrating a pair of illumination beams in accordance with one or more embodiments of the present disclosure.
FIG. 3B is a top view of an illumination pupil illustrating two pairs of illumination beams, in accordance with one or more embodiments of the present disclosure.

FIG. 3A is a top view of an illumination pupil 302 illustrating a pair of illumination beams 108*a*, 108*b* in accordance with one or more embodiments of the present disclosure. The pair of illumination beams 108*a*, 108*b* may correspond to dipole illumination having a dipole separation axis along the X direction in the figure and may thus be suitable for imaging Moiré structures with periodicity along the Y direction (e.g., Moiré structures 204*a*,204*b* in the top-right and bottom-left quadrants of FIG. 2A). For example, the pair of illumination beams 108*a*, 108*b* provide illumination at opposing azimuth incidence angles and common polar incidence angles. The illumination beams 108*a-b* are shown as circular illumination lobes upon the illumination pupil 302. However, the illumination lobes may take any shape or form including, but not limited to, a circle, an ellipse, or other rounded shape.

It is contemplated herein that imaging based on dipole illumination (e.g., a pair of illumination beams 108) may mitigate illumination asymmetries and associated errors in overlay measurements. However, dipole illumination is not a requirement, and a single illumination beam 108 may be utilized in some embodiments.

FIG. 3B is a top view of an illumination pupil 302 illustrating two pairs of illumination beams 108*a-d*, in accordance with one or more embodiments of the present disclosure. In particular, FIG. 3B depicts a first pair of illumination beams 108*a*, 108*b* oriented along the X direction and a second pair of illumination beams 108*c*, 108*d* oriented along the Y direction (e.g., a quadrupole illumination). It is contemplated herein that the quadrupole illumination distribution may be suitable for imaging a 2D overlay target 104 having grating structures oriented along two different (e.g., orthogonal) directions, where illumination beams 108*a*, 108*b* are suitable for imaging Moiré structures with periodicity along the Y direction (e.g., Moiré structures 204*a*,204*b* in the top-right and bottom-left quadrants of FIG. 2A) and illumination beams 108*c*, 108*d* are suitable imaging Moiré structures with periodicity along the X direction (e.g., Moiré structures 204*a*,204*b* in the bottom-right and top-left quadrants of FIG. 2A).

Figure 4:
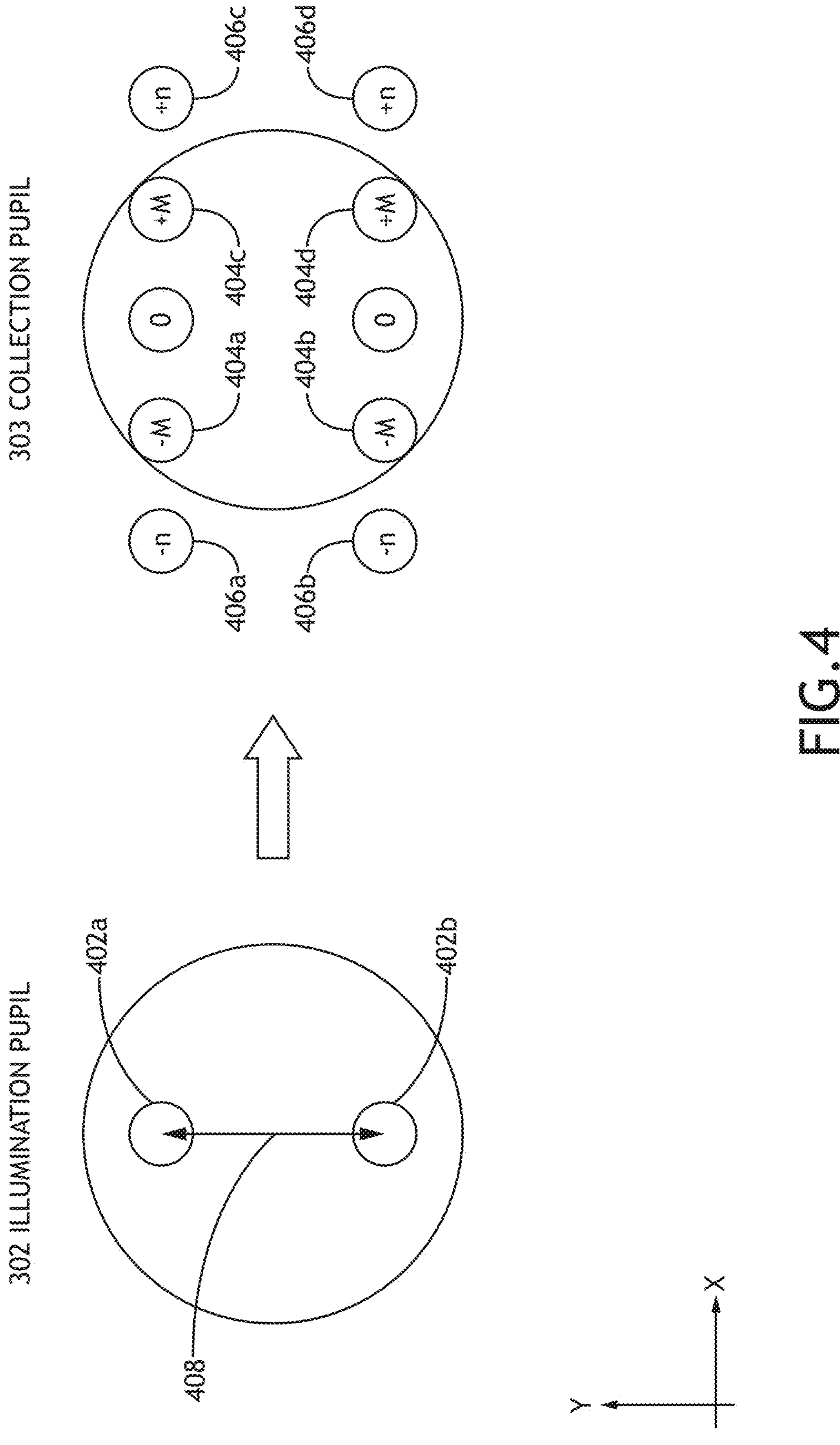
FIG. 4 illustrates a configuration for imaging Moiré structures having periodicity along an X direction with oblique illumination having azimuth incidence angles along the Y direction, in accordance with one or more embodiments of the disclosure.

FIG. 4 illustrates a configuration for imaging Moiré structures having periodicity along an X direction with oblique illumination having azimuth incidence angles along the Y direction, in accordance with one or more embodiments of the disclosure. The illumination pupil 302 is shown with two illumination lobes 402*a*, 402*b* in a dipole configuration with a dipole separation direction along the Y direction (e.g., azimuth incidence angles along the Y direction). The collection pupil 303 is shown having included first Moiré diffraction orders 404*a-d* (+/−1M) while excluding higher order diffraction (+/−n) 406*a-d*, where the higher order diffraction 406*a-d* may include higher-order Moiré diffraction and/or diffraction from individual gratings in the Moiré structure (e.g., diffraction associated with the P or Q pitches alone). In this way, the objective lens 142 may operate as a filter to exclude the higher-order diffraction 406*a-d*. In some embodiments, the overlay metrology sub-system 102 may include one or more blockers in the collection pupil 203 configured to block unwanted diffraction orders that are collected by the objective lens 142.

Figure 5:
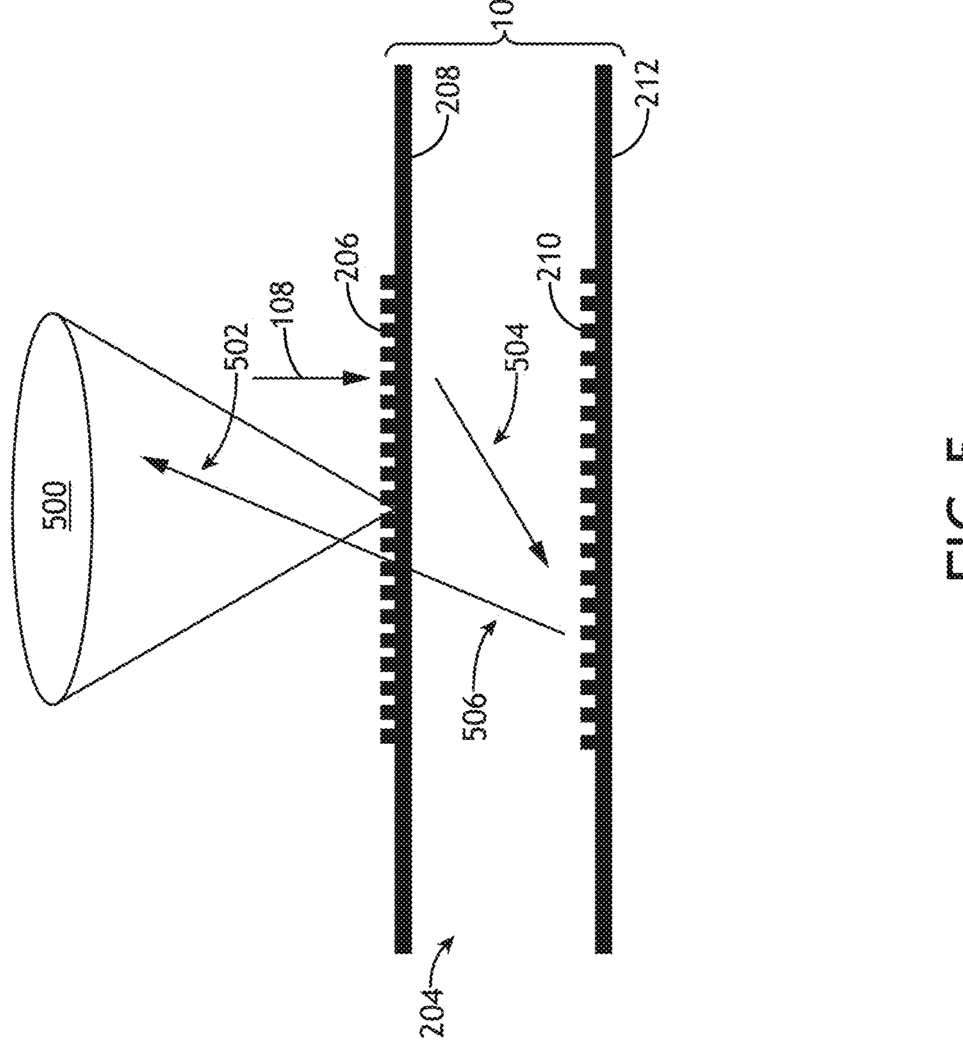
FIG. 5 is a conceptual schematic illustrating the collection of a Moiré diffraction lobe from an overlay target, in accordance with one or more embodiments of the present disclosure.

FIG. 5 is a conceptual schematic illustrating the collection of a Moiré diffraction lobe 502 (e.g., a double-diffraction lobe) from an overlay target 104 (e.g., a rAIM overlay target), in accordance with one or more embodiments of the present disclosure. FIG. 5 depicts an illumination beam 108 directed to an overlay target 104 with an azimuth angle along the Y direction and orthogonal to the direction of periodicity of the Moiré structure, where the Moiré diffraction lobe is associated with first-order diffraction from both gratings 206,210 along the X direction. For example, the Moiré diffraction lobe 502 may be formed from a first-order diffraction lobe 504 from the upper grating 206 that serves as the basis of a first-order diffraction lobe 506 from the lower grating 310*b*. Further, the Moiré diffraction lobe 502 is shown as entering the collection NA 500.

Referring again to FIG. 4, it is noted that although the illumination beams 602*a*,602*b* have azimuth incidence angles along the Y direction, the Moiré structures generate diffraction orders distributed according to the direction of periodicity (here, the X direction). However, the polar incidence angle (e.g., associated with a deviation of the illumination beams 402*a*,402*b* from a center of the illumination pupil 302) may control a placement of the associated diffraction (including zero-order diffraction) along the Y direction.

It is contemplated herein that an image of the Moiré structure may include Moiré fringes at a Moiré pitch (e.g., a pitch associated with a Moiré diffraction lobe 502), which is associated with spatially varying overlap between the gratings on the different sample layers. The Moiré pitch is typically a longer pitch than either of the grating structures and is related to the difference between the pitches of the grating structures. For example, the Moiré pitch (M) may be characterized as:

$$M = \frac{P \cdot Q}{P - Q} \tag{1}$$

where P is the period of a first grating structure on a first layer, and Q is the period of the second grating structure on the second layer.

In embodiments, a physical shift of one grating with respect to another grating in a Moiré structure (e.g., an overlay error associated with a relative shift of two sample layers on a sample) along a direction of periodicity will result in a corresponding lateral shift of the Moiré fringes along the measurement direction. Further, the magnitude of the shift of the Moiré fringes is typically greater than the magnitude of the physical shift. In particular, the magnitude of the shift of the Moiré fringes is proportional to the physical shift (e.g., the overlay error) by a conditional Moiré factor, which depends on the frame of reference. In this regard, an overlay measurement may be performed by measuring a shift of the Moiré fringes along the direction of periodicity of the associated grating structures on a metrology target and adjusting this value by a Moiré gain, which will depend on the particular design of the metrology target and the particular measurements made. The use of Moiré structures in overlay metrology is generally described in U.S. Pat. No. 7,540,105 issued on Oct. 21, 2008, U.S. Pat. No. 7,249,105 issued on Mar. 25, 2008, and U.S. Patent Appl. Publ. No. 2018/0188663 published on Jul. 5, 2018, all of which are incorporated herein in their entirety.

It is further contemplated herein that orthogonal oblique illumination as shown in FIG. 4 provides substantial flexibility with respect to the pitches of the Moiré structures and/or wavelengths used for imaging.

Figure 6:
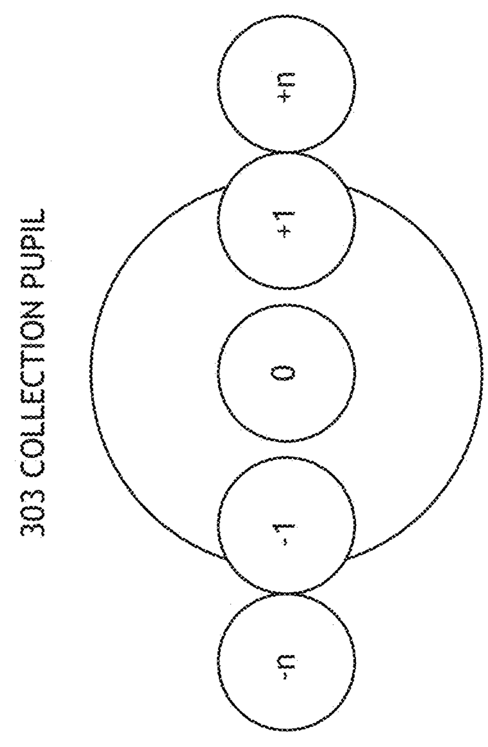
FIG. 6 illustrates a typical configuration for normal sample illumination and imaging, in accordance with one or more embodiments of the disclosure.
Figure 6:
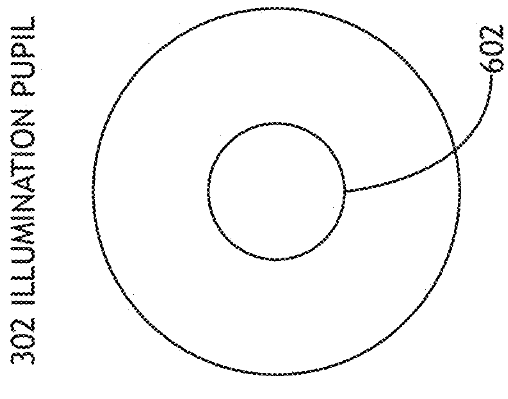
Figure 6:
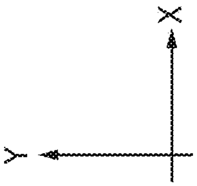

As an illustration, FIG. 6 illustrates a typical configuration for normal sample illumination and imaging, in accordance with one or more embodiments of the disclosure. In FIG. 6, an illumination lobe 602 is directed to a Moiré structure at normal incidence (e.g., centered in an illumination pupil 302). Diffracted light (e.g., Moiré diffraction lobes) may be distributed along a direction of periodicity of the imaged Moiré structures (here, the X direction), but are not displaced along the Y direction.

The typical normal illumination condition depicted in FIG. 6 may impose substantial limitations on the wavelength and pitch combinations that allow for imaging based on Moiré diffraction lobes, particularly when considering relatively large pitches. The relationship between pitches of the two layers (P and Q), the illumination wavelength (λ), the illumination NA ($NA_{ill}$), and the collection NA ($NA_{coll}$) is shown for the configuration in FIG. 6 is shown below:

$$\frac{\lambda}{P} - NA_{ill} > NA_{coll} \quad (2)$$

$$\frac{\lambda}{Q} - NA_{ill} > NA_{coll} \quad (3)$$

$$\frac{\lambda(P-Q)}{PQ} + NA_{ill} < NA_{coll}. \quad (4)$$

As an illustration, for a first set of overlay targets 104 having a first layer pitch of P=600 nm, a second layer pitch of Q=500 nm, $NA_{ill}$=0.4, and a $NA_{coll}$=0.7, the following results are obtained:

$$\frac{\lambda}{600} - 0.4 > 0.7 \Rightarrow \lambda > 660 \text{ nm} \quad (5)$$

-continued $$\frac{\lambda}{500} - 0.4 > 0.7 \Rightarrow \lambda > 550 \text{ nm} \quad (6)$$

$$\frac{\lambda}{3000} + 0.4 < 0.7 \Rightarrow \lambda < 900 \text{ nm}. \quad (7)$$

In this case, the usable spectrum for the first set of overlay targets is between 660 nm and 900 nm, which may be undesirably limited.

As another illustration, for a second set of overlay targets 104 having a first layer pitch of P=750 nm, a second layer pitch of Q=600 nm, $NA_{ill}$=0.4, and a $NA_{coll}$=0.7, the following results are obtained:

$$\frac{\lambda}{750} - 0.4 > 0.7 \Rightarrow \lambda > 825 \text{ nm} \quad (8)$$

$$\frac{\lambda}{600} - 0.4 > 0.7 \Rightarrow \lambda > 660 \text{ nm} \quad (9)$$

$$\frac{\lambda}{3000} + 0.4 < 0.7 \Rightarrow \lambda < 900 \text{ nm} \quad (10)$$

In this case with larger pitches, the usable spectrum for the first set of overlay targets is between 825 nm and 900 nm, which is even more limiting.

However, imaging based on oblique orthogonal illumination as disclosed herein may provide wider imaging conditions. For example, for oblique dipole illumination, assuming d is the dipole separation distance 408 between the illumination lobes center-to-center) and the radius of the illumination lobes is r (e.g., in pupil plane space), the relationship between pitch (P), dipole separation distance 408 (*d*) and the collection NA ($NA_{coll}$) can be described as:

$$\left(\frac{\lambda}{P}\right)^2 + \left(\frac{d}{2}\right)^2 > (NA_{coll} + r)^2 \quad (11)$$

Similarly, the relationship between pitch Q, d, and $NA_{coll}$ can be described as:

$$\left(\frac{\lambda}{Q}\right)^2 + \left(\frac{d}{2}\right)^2 > (NA_{coll} + r)^2 \quad (12)$$

When both pitch P and pitch Q are considered and constrained such that the first Moiré diffraction orders fit within the collection NA, the relationship can be described as:

$$\left(\frac{\lambda(P-Q)}{PQ}\right)^2 + \left(\frac{d}{2}\right)^2 < (NA_{coll} - r)^2 \quad (13)$$

Considering the same examples above, for an overlay target 104 where P=600 nm and Q=500 nm, d=0.8, r=0.14 and $NA_{coll}$=0.7, the following results are obtained:

$$\left(\frac{\lambda}{600}\right)^2 + 0.4^2 > (0.7 + 0.14)^2 \Rightarrow \quad (14)$$

$$\left(\frac{\lambda}{600}\right)^2 > (0.7 + 0.14)^2 - 0.4^2 \Rightarrow \lambda > 443 \text{ nm}$$

-continued $$\left(\frac{\lambda}{500}\right)^2 + 0.4^2 > (0.7+0.14)^2 \Rightarrow \tag{15}$$

$$\left(\frac{\lambda}{500}\right)^2 > (0.7+0.14)^2 - 0.4^2 \Rightarrow \lambda > 369 \text{ nm}$$

$$\left(\frac{\lambda}{3000}\right)^2 + 0.4^2 < (0.7-0.14)^2 \Rightarrow \tag{16}$$

$$\left(\frac{\lambda}{3000}\right)^2 < (0.7-0.14)^2 - 0.4^2 \Rightarrow \lambda < 1175 \text{ nm}$$

In this case, the usable bandwidth is in a range of 443-1175 nm, which is substantially larger than the 660 nm-900 nm range for the normal illumination case.

Similarly, for the case of P=750 nm and Q=600 nm, d=0.8, r=0.14 and $NA_{coll}$=0.7, the following results are obtained:

$$\left(\frac{\lambda}{600}\right)^2 + 0.4^2 > (0.7+0.14)^2 \Rightarrow \tag{17}$$

$$\left(\frac{\lambda}{600}\right)^2 > (0.7+0.14)^2 - 0.4^2 \Rightarrow \lambda > 443 \text{ nm}$$

$$\left(\frac{\lambda}{750}\right)^2 + 0.4^2 > (0.7+0.14)^2 \Rightarrow \tag{18}$$

$$\left(\frac{\lambda}{750}\right)^2 > (0.7+0.14)^2 - 0.4^2 \Rightarrow \lambda > 554 \text{ nm}$$

$$\left(\frac{\lambda}{3000}\right)^2 + 0.4^2 < (0.7-0.14)^2 \Rightarrow \tag{19}$$

$$\left(\frac{\lambda}{3000}\right)^2 < (0.7-0.14)^2 - 0.4^2 \Rightarrow \lambda < 1175 \text{ nm.}$$

In this case, the usable bandwidth is in a range of 554-1175 nm, which is also substantially larger than the 825-900 nm range for the normal illumination case.

It is further contemplated herein that changing the polar incidence angle of an illumination beam 108 (or a dipole separation distance d in the case of a dipole) may further impact the spectral range of wavelengths suitable for a measurement. As an illustration, increasing the dipole separation distance of the above example, to d=1 provides the following:

$$\left(\frac{\lambda}{600}\right)^2 + 0.5^2 > (0.7+0.14)^2 \Rightarrow \tag{20}$$

$$\left(\frac{\lambda}{600}\right)^2 > (0.7+0.14)^2 - 0.5^2 \Rightarrow \lambda > 405 \text{ nm}$$

$$\left(\frac{\lambda}{750}\right)^2 + 0.5^2 > (0.7+0.14)^2 \Rightarrow \tag{21}$$

$$\left(\frac{\lambda}{750}\right)^2 > (0.7+0.14)^2 - 0.5^2 \Rightarrow \lambda > 506 \text{ nm}$$

$$\left(\frac{\lambda}{3000}\right)^2 + 0.5^2 < (0.7-0.14)^2 \Rightarrow \tag{22}$$

$$\left(\frac{\lambda}{3000}\right)^2 < (0.7-0.14)^2 - 0.5^2 \Rightarrow \lambda < 756 \text{ nm.}$$

In this case, increasing the polar incidence angles shifted the allowable wavelengths to lower values in a range of 506 nm to 756 nm.

Although the examples above are merely illustrative and non-limiting, they demonstrate that oblique orthogonal illumination provides substantially improved flexibility for wavelength selection based on particular selected pitches of a Moiré structure. Additionally, oblique orthogonal illumination as disclosed herein may enable the design of targets with pitches not accessible using traditional imaging techniques. In a general sense, oblique orthogonal illumination enables flexible control over the combination of wavelength, pitches, and dipole separation distance for a particular image, which may be defined using a metrology recipe. This flexibility may enable preferred wavelengths suitable for robust measurements for a wide range of target designs. For example, a metrology recipe may select a dipole separation distance of one of the one or more pairs of the illumination beams that causes an exclusion of diffraction orders other than the first Moiré diffraction order and the zero-diffraction order by a collection pupil. In another example, a metrology recipe may select one or more pairs of the illumination beams that results in an additional usable bandwidth associated with one of the one or more pairs of the illumination beams capable of causing an exclusion of diffraction orders other than the first Moiré diffraction order and the zero diffraction order by a collection pupil. In another example, a metrology recipe may select an overlay target with Moiré structures (e.g., with specific pitches for one or both or more gratings of the Moiré structures) that results in an additional usable bandwidth associated with one of the one or more pairs of the illumination beams capable of causing exclusion of diffraction orders other than the first Moiré diffraction order and the zero diffraction order by a collection pupil.

Additionally, oblique orthogonal illumination as disclosed herein may enable selection of different wavelengths for different pitches in an overlay target 104. As an illustration in a case of an overlay target 104 including both PQ Moiré structures and ST Moiré structures, one or more illumination beams 108 may include a first wavelength (or set of wavelengths) suitable for imaging the PQ Moiré structures and a second wavelength (or second set of wavelengths) suitable for imaging the ST Moiré structures. In this way, the broad bandwidth enabled by the systems and methods disclosed herein may enable flexible selection of both the first and second wavelengths.

Figure 7A:
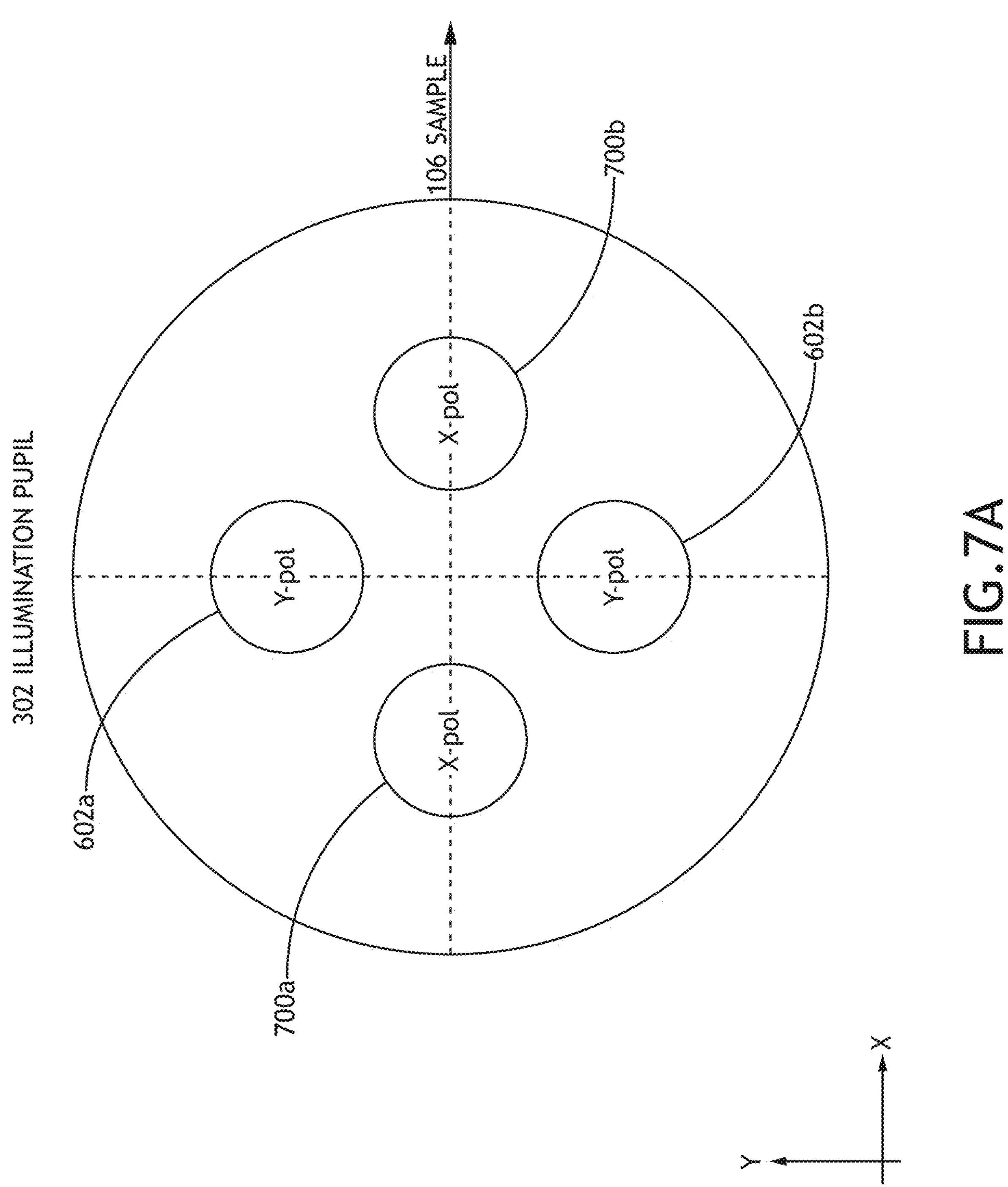
FIG. 7A illustrates an illumination pupil providing quadrupole illumination, in accordance with one or more embodiments of the present disclosure.
Figure 7B:
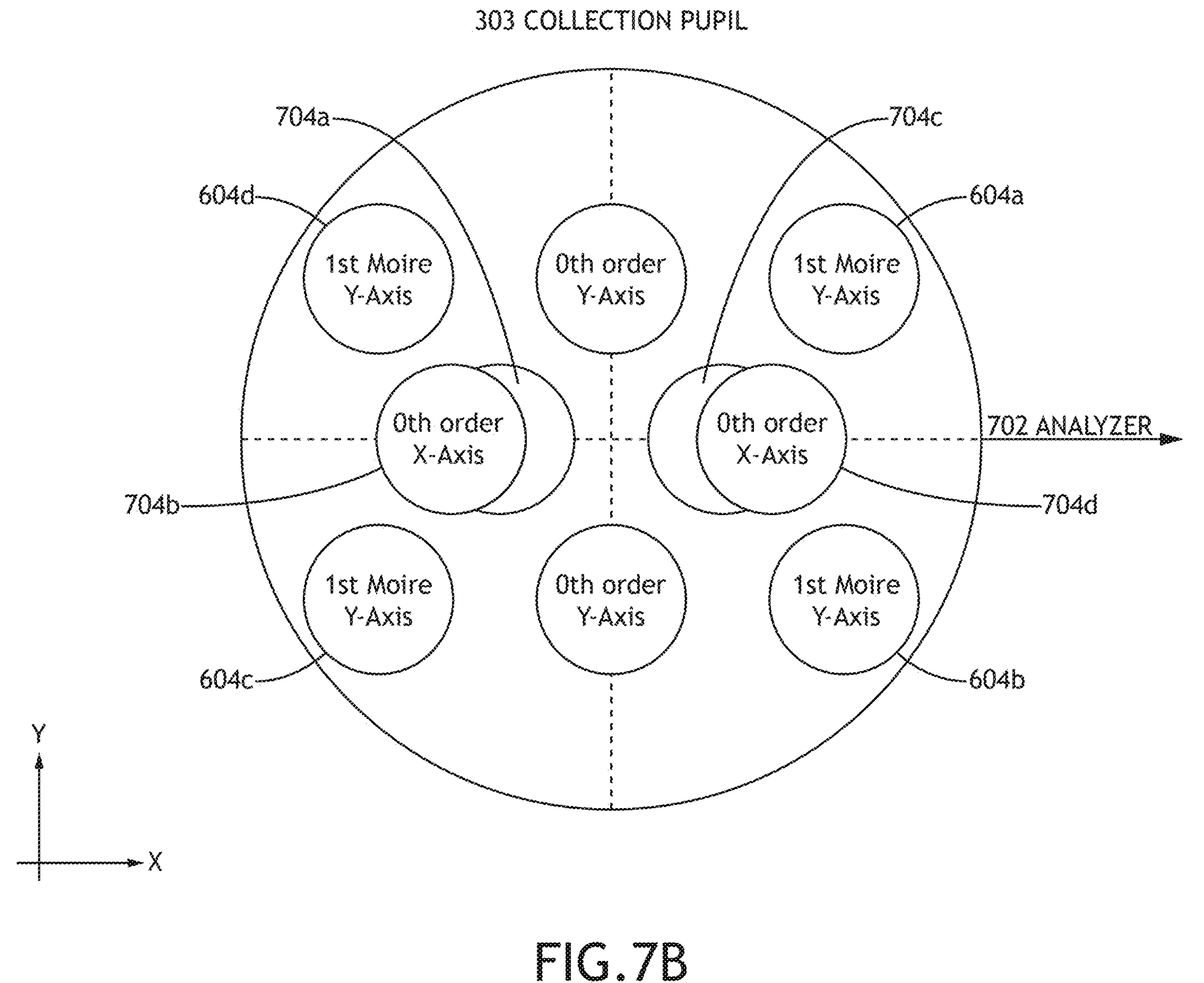
FIG. 7B illustrates a distribution of diffraction orders in a collection pupil generated by illuminating Moiré structures with periodicity along the X direction with the quadrupole illumination profile shown in FIG. 7A, in accordance with one or more embodiments of the present disclosure.
Figure 7C:
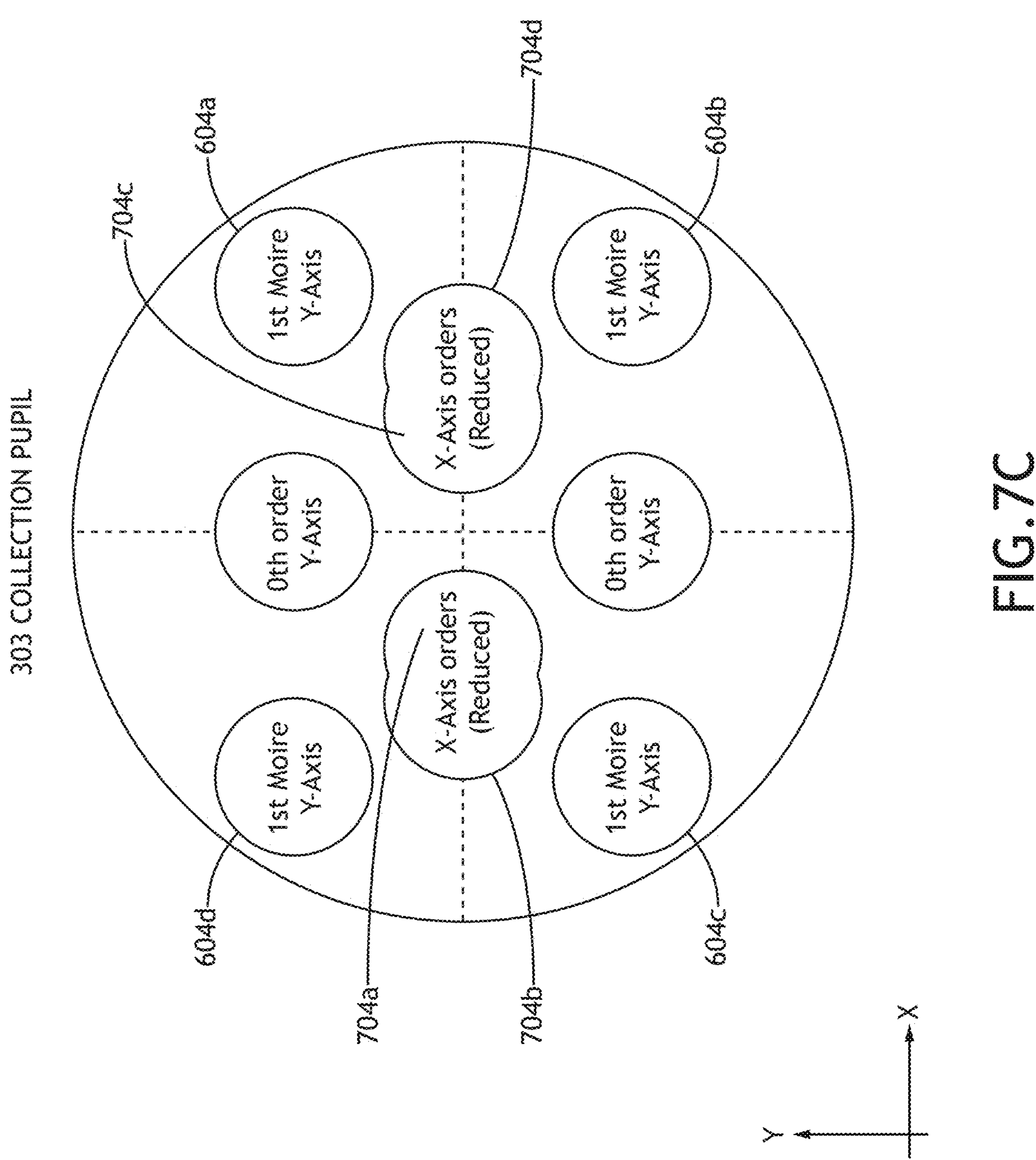
FIG. 7C illustrates a distribution of diffraction lobes in FIG. 7B after filtering undesired diffraction lobes, in accordance with one or more embodiments of the present disclosure.

Referring now to FIGS. 7A-7C, imaging overlay targets 104 with some Moiré structures having periodicity along one measurement direction and some Moiré structures having periodicity along another measurement direction are described, in accordance with one or more embodiments of the present disclosure.

FIG. 7A illustrates an illumination pupil 302 providing quadrupole illumination, in accordance with one or more embodiments of the present disclosure. In FIG. 7A, the illumination pupil 302 includes a first pair of illumination lobes 602*a-b* (e.g., first and second illumination lobes) oriented along a Y-axis suitable for imaging Moiré structures with directions of periodicity along the X-axis, along with a second pair of illumination lobes 700*a*, 700*b* (e.g., third and fourth illumination lobes) oriented along an X-axis (e.g., orthogonal to the Y-axis) suitable for imaging Moiré structures with directions of periodicity along the Y-axis.

When measuring in two directions (e.g., orthogonal directions), it may be desirable to distinguish signals for each measurement direction. In some embodiments, the overlay metrology sub-system 102 includes two collection channels for separate imaging of Moiré structures with orthogonal directions of periodicity. For example, a first collection channel may capture images of one or more Moiré structures having periodicity along the X direction based on diffraction of one or more illumination beams 108 with azimuth angles along the Y direction, while a second collection channel may capture images of one or more Moiré structures having periodicity along the Y direction based on diffraction of one or more illumination beams 108 with azimuth angles along the X direction.

Accordingly, it may be desirable to filter out (e.g., block) diffraction of illumination beams 108 with a particular azimuth incidence angle by Moiré structures with periodicity parallel to the particular azimuth incidence angle from a collection channel.

FIG. 7B illustrates a distribution of diffraction orders in a collection pupil 303 generated by illuminating Moiré structures with periodicity along the X direction with the quadrupole illumination profile shown in FIG. 7A, and depicting Y-axis Moiré diffraction lobes 604*a*, 604*b*, 604*c*, 604*d*, in accordance with one or more embodiments of the present disclosure. The collection pupil 303 distribution in FIG. 7B is similar to that in FIG. 4 except that FIG. 7B also includes Moiré diffraction lobes 704*a*,704*c* and zero-order diffraction lobes 704*b*, 704*d* associated with the illumination beams 700*a*, 700*b* (oriented along the X direction), which are undesirable and should not contribute to image formation. FIG. 7C illustrates a distribution of diffraction lobes in FIG. 7B after filtering undesired diffraction lobes, in accordance with one or more embodiments of the present disclosure.

Such undesired diffraction lobes may be blocked using a variety of techniques including, but not limited to, wavelength filtering, polarization filtering, or pupil division techniques (e.g., directing different portions of a collection pupil 303 to different collection channels).

In some embodiments, undesired diffraction lobes may be filtered using wavelength-based techniques. For example, illumination beams 602*a*,602*b* may have different spectral content than illumination beams 700*a*, 700*b*. In this configuration, the overlay metrology sub-system 102 may include wavelength filters in two collection channels to filter out unwanted diffraction lobes and/or isolate desired diffraction lobes.

In some embodiments, undesired diffraction lobes may be filtered using polarization-based techniques. For example, illumination beams 602*a*,602*b* may have different polarizations than illumination beams 700*a*, 700*b* (e.g., orthogonal polarizations). In this configuration, the collection subsystem optics 146 may include one or more polarizers (e.g., such as analyzers 702) to separate diffraction lobes into separate collection channels.

In some embodiments, undesired diffraction lobes may be filtered using pupil-splitting techniques. For example, the overlay metrology sub-system 102 may include one or more prisms or other pupil-splitting devices to distribute light into different collection channels based on position in the collection pupil 303.

It is to be understood that FIGS. 7B and 7C depict only diffraction lobes associated with Moiré structures having periodicity along the X direction for clarity. However, the collection pupil 303 may also include distribution of diffraction orders from Moiré structures having periodicity along the Y direction, which may correspond to 90-degree rotation of FIGS. 7B and 7C, respectively.

Figure 8:
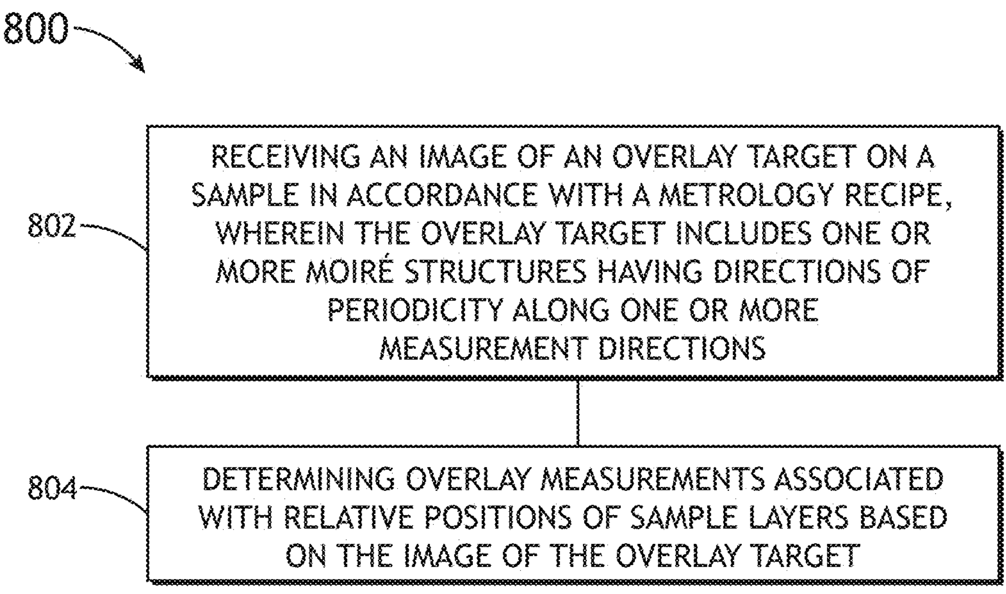
FIG. 8 is a process flow diagram depicting a method for overlay metrology, in accordance with one or more embodiments of the disclosure. The method may be performed via the overlay metrology system as described herein.

FIG. 8 is a process flow diagram depicting a method 800 for overlay metrology, in accordance with one or more embodiments of the disclosure. The method 800 may be performed via the overlay metrology system 100 as described herein.

In embodiments, the method 800 includes a step 802 of receiving an image of an overlay target on a sample in accordance with a metrology recipe, wherein the overlay target includes one or more Moiré structures having directions of periodicity along one or more measurement directions, wherein the image is generated by illuminating the overlay target with oblique illumination having one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction. The plurality of Moiré structures may also include Moiré structures comprising two or more gratings with overlapping regions.

In embodiments, the method 800 includes a step 804 of determining overlay measurements associated with relative positions of sample layers along the one or more measurement directions based on the image of the overlay target.

As described previously herein, the overlay metrology sub-system 102 may be configured according to one or more metrology recipes, which may control various parameters of the overlay metrology sub-system 102 including, but not limited to, components in the illumination sub-system 117, components in the collection sub-system 130, or the detector 144. In this way, the overlay metrology sub-system 102 may be configured to provide only two selected diffraction lobes by a known overlay target 104 (or target design) in a collection pupil plane in response to the illumination channels 118*a*, 118*b*. For example, the metrology recipe may provide that only the two selected diffraction lobes are collected by the collection pupil 303. In another example, the metrology recipe may provide that only three direction lobes (e.g., first Moiré diffraction orders 404*a-d* (+/−1M) and zero order diffraction) are collected by the collection pupil. In another example, an image formed by one or more illumination beams 108 may be generated exclusively with first Moiré diffraction orders and a zero-diffraction order.

As described herein, The ability of the systems and method to include first order Moiré diffraction lobes and exclude second and greater diffraction orders may also increase the available illumination bandwidth as well as increase the range of grating pitches that can be measured, enabling the system to measure not only the finely pitched structures in robust advanced imaging (rAIM) technology, but also larger features, such as larger features utilized in continuous diffraction based overlay (CDBO) patterns.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 112 may include any device configured to execute algorithms and/or instructions (e.g., program instructions stored in memory). In one embodiment, the one or more processors 112 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure.

Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 110 or, alternatively, multiple controllers. Additionally, the controller 110 may include one or more controllers housed in a common housing or within multiple housings. In this way, any controller or combination of controllers may be separately packaged as a module suitable for integration into the overlay metrology system 100.

While implementations of method 800 are discussed herein, it is further contemplated that various steps of the method 800 may be included, excluded, rearranged, and/or implemented in many ways without departing from the essence of the present disclosure. Accordingly, the foregoing embodiments and implementations of method 800 are included by way of example only and are not intended to limit the present disclosure in any way.

In embodiments, the one or more processors 112 of a controller 110 may include any processing element known in the art. In this sense, the one or more processors 112 may include any microprocessor-type device configured to execute algorithms and/or instructions. Further, the memory 114 may include any storage medium known in the art suitable for storing program instructions executable by the associated one or more processors 112. For example, the memory 114 may include a non-transitory memory medium. As an additional example, the memory 114 may include, but is not limited to, a read-only memory, a random-access memory, a magnetic or optical memory device (e.g., disk), a magnetic tape, a solid-state drive and the like. It is further noted that the memory 114 may be housed in a common controller housing with the one or more processors 112.

All of the methods described herein may include storing results of one or more steps of the method embodiments in a memory medium. The results may include any of the results described herein and may be stored in any manner known in the art. The memory medium may include any memory medium described herein, or any other suitable memory medium known in the art. After the results have been stored, the results can be accessed in the memory medium and used by any of the method or system embodiments described herein, formatted for display to a user, used by another software module, method, or system, etc. Furthermore, the results may be stored "permanently," "semi-permanently," temporarily," or for some period of time. For example, the memory medium may be random access memory (RAM), and the results may not necessarily persist indefinitely in the memory medium.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. An overlay metrology system comprising:

one or more controllers comprising one or more processors configured to execute program instructions configured to:

receive an image of an overlay target on a sample in accordance with a metrology recipe, wherein the overlay target includes one or more Moiré structures having directions of periodicity along one or more measurement directions, wherein the image is generated by illuminating the overlay target with oblique illumination having one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction; and determine overlay measurements associated with relative positions of sample layers along the one or more measurement directions based on the image of the overlay target.

2. The overlay metrology system of claim 1, wherein the one or more Moiré structures comprises a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity.

3. The overlay metrology system of claim 1, wherein the one or more Moiré structures comprises:

a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity; and a second Moiré structure comprising:

a third grating with the second pitch on the first layer of the sample; and a fourth grating with the first pitch of the second layer of the sample, wherein the third grating and the fourth grating are formed in a second overlapping region of the sample and have common directions of periodicity.

4. The overlay metrology system of claim 1, wherein the one or more Moiré structures comprises:

a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity; and a second Moiré structure comprising:

a third grating with a third pitch on the first layer of the sample; and a fourth grating with a fourth pitch of the second layer of the sample, wherein the third grating, the fourth grating, and at least one of the first grating or the second grating all have different pitches, wherein the third grating and the fourth grating are formed in a second overlapping region of the sample and have common directions of periodicity.

5. The overlay metrology system of claim 1, wherein the one or more oblique illumination beams are in a dipole distribution.

6. The overlay metrology system of claim 1, wherein the one or more oblique illumination beams are in a quadrupole distribution.

7. The overlay metrology system of claim 1, further comprising an optical element configured to split illumination into different channels based upon a position of the illumination in a collection pupil.

8. The overlay metrology system of claim 1, wherein the image formed by one or more illumination beams is generated exclusively with first Moiré diffraction orders and a zero-diffraction order.

9. The overlay metrology system of claim 1, wherein polar incidence angles of the one or more oblique illumination beams are adjustable.

10. The overlay metrology system of claim 1, wherein the overlay target comprises:

a robust advanced imaging metrology (rAIM) target.

11. The overlay metrology system of claim 1, wherein at least two of the one or more oblique illumination beams have different wavelengths.

12. The overlay metrology system of claim 11, further comprising a collection sub-system configured to separately collect illumination of different wavelengths of each illumination beam of two of the one or more oblique illumination beams.

13. The overlay metrology system of claim 1, wherein the one or more Moiré structures comprises:

one or more first Moiré structures having directions of periodicity along a first measurement direction of the one or more measurement directions, wherein portions of the image associated with the one or more first Moiré structures are formed via Moiré diffraction orders from at least one of the one or more oblique illumination beams having an azimuth incidence angle orthogonal to the first measurement direction; and one or more second Moiré structures having directions of periodicity along a second measurement direction of the one or more measurement directions, wherein portions of the image associated with the one or more second Moiré structures are formed via Moiré diffraction orders from at least one of the one or more oblique illumination beams having an azimuth incidence direction orthogonal to the second measurement direction.

14. The overlay metrology system of claim 13, wherein the one or more oblique illumination beams comprise two oblique illumination beams in a quadrupole distribution having the azimuth incidence angle orthogonal to the first measurement direction and two oblique illumination beams having the azimuth incidence angle orthogonal to the second measurement direction.

15. The overlay metrology system of claim 13, further comprising an analyzer configured to polarize illumination from one of the one or more oblique illumination beams.

16. An overlay metrology system comprising:

an illumination sub-system including one or more lenses configured to illuminate via oblique illumination an overlay target on a sample in accordance with a metrology recipe, wherein the overlay target includes one or more Moiré structures having directions of periodicity along one or more measurement directions, wherein an image is generated by illuminating the overlay target one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction;

a collection sub-system including at least an objective lens configured to collect at least one Moiré diffraction order associated with diffraction of the one or more Moiré structures by the one or more oblique illumination beams;

a detector configured to generate an image of the overlay target using illumination collected by the collection sub-system; and a controller communicatively coupled to the collection sub-system, the controller including one or more processors configured to execute program instructions causing the one or more processors to:

receive the image of the overlay target; and determine overlay measurements associated with relative positions of sample layers along the one or more measurement directions based on the image of the overlay target.

17. The overlay metrology system of claim 16, wherein the one or more Moiré structures comprises a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity.

18. The overlay metrology system of claim 16, wherein the one or more Moiré structures comprises:

a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity; and a second Moiré structure comprising:

a third grating with the second pitch on the first layer of the sample; and a fourth grating with the first pitch of the second layer of the sample, wherein the third grating and the fourth grating are formed in a second overlapping region of the sample and have common directions of periodicity.

19. The overlay metrology system of claim 16, wherein the one or more Moiré structures comprises:

a first Moiré structure comprising:

a first grating with a first pitch on a first layer of the sample; and a second grating with a second pitch on a second layer of the sample, wherein the first grating and the second grating are formed in a first overlapping region of the sample, wherein the first grating and the second grating have different pitches and have common directions of periodicity; and a second Moiré structure comprising:

a third grating with a third pitch on the first layer of the sample; and a fourth grating with a fourth pitch of the second layer of the sample, wherein the third grating, the fourth grating, and at least one of the first grating or the second grating all have different pitches, wherein the third grating and the fourth grating are formed in a second overlapping region of the sample and have common directions of periodicity.

20. The overlay metrology system of claim 16, wherein the one or more oblique illumination beams are in a dipole distribution.

21. The overlay metrology system of claim 16, wherein the one or more oblique illumination beams are in a quadrupole distribution.

22. The overlay metrology system of claim 16, wherein the collection sub-system comprises collection sub-system optics configured to split illumination into different channels based upon a position of the illumination in a collection pupil.

23. The overlay metrology system of claim 16, wherein the image formed by one or more illumination beams is generated exclusively with first Moiré diffraction orders and a zero-diffraction order.

24. The overlay metrology system of claim 16, wherein polar incidence angles of the one or more oblique illumination beams are adjustable.

25. The overlay metrology system of claim 16, wherein the overlay target comprises:

a robust advanced imaging metrology (rAIM) target.

26. The overlay metrology system of claim 16, wherein at least two of the one or more oblique illumination beams have different wavelengths.

27. The overlay metrology system of claim 26, wherein the collection sub-system is configured to separately collect illumination of different wavelengths of each illumination beam of two of the one or more oblique illumination beams.

28. The overlay metrology system of claim 16, wherein the one or more Moiré structures comprises:

one or more first Moiré structures having directions of periodicity along a first measurement direction of the one or more measurement directions, wherein portions of the image associated with the one or more first Moiré structures are formed via Moiré diffraction orders from at least one of the one or more oblique illumination beams having an azimuth incidence angle orthogonal to the first measurement direction; and one or more second Moiré structures having directions of periodicity along a second measurement direction of the one or more measurement directions, wherein portions of the image associated with the one or more second Moiré structures are formed via Moiré diffraction orders from at least one of the one or more oblique illumination beams having an azimuth incidence direction orthogonal to the second measurement direction.

29. The overlay metrology system of claim 28, wherein the one or more oblique illumination beams comprise two oblique illumination beams in a quadrupole distribution having the azimuth incidence angle orthogonal to the first measurement direction and two oblique illumination beams having the azimuth incidence angle orthogonal to the second measurement direction.

30. The overlay metrology system of claim 28, wherein the collection sub-system comprises an analyzer configured to polarize illumination from one of the one or more oblique illumination beams.

31. A metrology method comprising:

receiving an image of an overlay target on a sample in accordance with a metrology recipe, wherein the overlay target includes one or more Moiré structures having directions of periodicity along one or more measurement directions, wherein the image is generated by illuminating the overlay target with oblique illumination having one or more oblique illumination beams, wherein a particular Moiré structure of the one or more Moiré structures comprises overlapping gratings with different pitches along a particular measurement direction, wherein a portion of the image associated with the particular Moiré structure is formed via Moiré diffraction orders from at least one of the one or more oblique illumination beams having an azimuth incidence direction orthogonal to the particular measurement direction; and determining overlay measurements associated with relative positions of sample layers along the one or more measurement directions based on the image of the overlay target.

* * * * *